(12) United States Patent
Bock

(10) Patent No.: US 7,635,497 B2
(45) Date of Patent: Dec. 22, 2009

(54) METHOD AND DEVICE FOR PRODUCING A SYSTEM HAVING A COMPONENT APPLIED TO A PREDETERMINED LOCATION OF A SURFACE OF A SUBSTRATE

(75) Inventor: Karlheinz Bock, Germering (DE)

(73) Assignee: Fraunhofer-Gesellschaft zur Förderung der angewandten Forschung e.V., Munich (DE)

( * ) Notice: Subject to any disclaimer, the term of this patent is extended or adjusted under 35 U.S.C. 154(b) by 0 days.

(21) Appl. No.: 11/551,666

(22) Filed: Oct. 20, 2006

(65) Prior Publication Data

US 2007/0040857 A1   Feb. 22, 2007

Related U.S. Application Data

(62) Division of application No. 10/861,289, filed on Jun. 4, 2004, now Pat. No. 7,195,714.

(30) Foreign Application Priority Data

Jun. 5, 2003   (DE)   ................................ 103 25 559

(51) Int. Cl.
*B41J 29/38* (2006.01)
(52) U.S. Cl. ........................................ 427/58
(58) Field of Classification Search .................. 427/58, 427/256; 428/901; 438/107
See application file for complete search history.

(56) References Cited

U.S. PATENT DOCUMENTS 3,615,750 A * 10/1971 Blair ........................ 106/31.25

(Continued)

FOREIGN PATENT DOCUMENTS

EP   1310533   5/2003

OTHER PUBLICATIONS

Jenkins, A., et al.; *Microcontact Printing of Lipophilic Self-Assembled Monolayers for the Attachment of Biomimetic Lipid Bilayers to Surfaces*; 1999; American Chemical Society.

(Continued)

*Primary Examiner*—Michael Cleveland
*Assistant Examiner*—Tabassom Tadayyon Eslami
(74) *Attorney, Agent, or Firm*—Michael A. Glenn; Glenn Patent Group

(57) ABSTRACT

A method for producing a system with a substrate with a surface and a component applied to a predetermined location of the surface of the substrate includes a step of generating a liquid volume containing the component and a step of applying the liquid volume containing the component on the surface of the substrate. At that, the liquid volume is sized so that it wets only a partial area of the surface of the substrate after its application. In the step of applying the liquid volume is placed on the surface of the substrate so that the partial area of the surface includes the predetermined location. The component or the predetermined location of the surface of the substrate is implemented so that after the application of the liquid volume a force acts on the component which is sufficient to drive the component within the liquid volume to the predetermined location. The method is completely independent of the speed of a gripper and its capability to grip and align a very small component.

19 Claims, 4 Drawing Sheets

U.S. PATENT DOCUMENTS

| | | | |
|---|---|---|---|
| 5,343,803 A | 9/1994 | Duchek et al. | |
| 6,481,826 B1 * | 11/2002 | Hara et al. | 347/29 |
| 6,527,964 B1 * | 3/2003 | Smith et al. | 216/19 |
| 6,682,175 B2 | 1/2004 | Otsuka et al. | |
| 6,731,353 B1 | 5/2004 | Credelle | 349/45 |
| 6,946,322 B2 | 9/2005 | Brewer | 438/109 |
| 2001/0031514 A1 | 10/2001 | Smith | 438/107 |
| 2002/0127864 A1 * | 9/2002 | Smith et al. | 438/692 |
| 2003/0059686 A1 * | 3/2003 | Kobayashi et al. | 430/5 |
| 2003/0180451 A1 * | 9/2003 | Kodas et al. | 427/123 |
| 2004/0003734 A1 | 1/2004 | Shively et al. | |
| 2004/0115344 A1 | 6/2004 | Newsome | |
| 2005/0223927 A1 * | 10/2005 | Wiedemer | 101/467 |
| 2006/0057293 A1 | 3/2006 | Sharma | |

OTHER PUBLICATIONS

Srinicasan, U. et al.; *Microstructure to Substrate Self-Assembly Using Capillary Forces*; 2001; IEEE.

Choi, et al.; "Method for Manufacturing Array Substrate for LCD"; Abstract of Korean Patent Publication No. KR-2001-086639 A, published Sep. 15, 2001.

* cited by examiner

METHOD AND DEVICE FOR PRODUCING A SYSTEM HAVING A COMPONENT APPLIED TO A PREDETERMINED LOCATION OF A SURFACE OF A SUBSTRATE

CROSS-REFERENCE TO RELATED APPLICATION

This application is a divisional of U.S. application Ser. No. 10/861,289, filed Jun. 4, 2004, now U.S. Pat. No. 7,195,714 and is incorporated herein by reference in its entirety.

BACKGROUND OF THE INVENTION

1. Field of the Invention

The present invention relates to a method and a device for producing a system having a substrate with a surface and a component applied to a predetermined location of the surface of the substrate, in particular to a micro-electronic or micro-mechanical component.

2. Description of the Related Art

Conventionally, electronic, microelectronic or micro-mechanical components or members, respectively, are applied in the so called pick-and-place-method to boards, semiconductor and other substrates or a package or a mounting unit, respectively. Hereby, components are provided on different carrier systems, for example bands. A gripper grabs or grips each individual component, moves it from the carrier system to the substrate, adjusts the same—for example based on optically detected information for a relative spatial arrangement of substrate and component—and introduces the same into the substrate or applies the same to the substrate, respectively. Simultaneously, in the case of an electronic or microelectronic component a contacting or a production, respectively, of one or several electrical contacts between the substrate and the component is performed using a suitable contacting process or mechanism, respectively, like e.g. the flip chip method.

The smaller the component, the more accurately the same generally needs to be aligned and the more effort is required for its exact adjustment. The described processes or method steps and thus the loading of a substrate with components using a pick-and-place-method is therefore generally very time-intensive. Therefore, only a limited throughput may be achieved in production. For example, the fastest pick-and-place die bond machines only process about 12000 units or components, respectively, per hour. In particular, for high-volume product categories or product categories with large production volumes, respectively, the conventional loading or assembling, respectively, therefore represents an obstacle for an increase of the production volume which may not be overcome. This is referred to as the assembly crisis.

SUMMARY OF THE INVENTION

It is the object of the present invention to provide a method and a device for producing a system having a substrate and a component applied to a predetermined location on a surface of the substrate, which is independent of the speed of a gripper.

In accordance with a first aspect, the present invention provides a method for producing a system having a substrate having a surface and a component applied to a predetermined location of the surface of the substrate, with the steps of generating a liquid volume containing the component; and applying the liquid volume containing the component onto the surface of the substrate, wherein the liquid volume is sized so that it wets only a partial area of the surface of the substrate after its application, wherein in the step of applying the liquid volume is placed on the surface of the substrate so that the partial area of the surface includes the predetermined location, and wherein the component or the predetermined location of the surface of the substrate is implemented so that after the application of the liquid volume a force acts on the component which is sufficient in order to drive the component within the liquid volume) to the predetermined location.

In accordance with a second aspect, the present invention provides a device for producing a system having a substrate with a surface and a component applied to a predetermined location of the surface of the substrate, having means for generating a liquid volume containing the component; and means for applying the liquid volume containing the component onto the surface of the substrate, wherein the liquid volume is sized so that it wets only a partial area of the surface of the substrate after its application, wherein means for applying the liquid volume is implemented so that the liquid volume may be placed on the surface of the substrate so that the partial area of the surface includes the predetermined location, and wherein the component or the predetermined location of the surface of the substrate is implemented so that after the application of the liquid volume a force acts on the component which is sufficient to drive the component within the liquid volume to the predetermined location.

The present invention is based on the finding, that electronic, microelectronic and micromechanical components, for example integrated circuits, continuously become smaller in the course of the quickly advancing general miniaturization.

The present invention is based on the idea to apply microchips and other miniaturized components onto a substrate within a drop of a liquid medium contained by an inkjet printing method or also by other printing techniques. More generally, it is the idea of the present invention to introduce components into a liquid medium and to generate drops or other small volumes of this liquid medium and apply the same onto the substrate. The liquid volume is thereby sized so that it only wets a partial area of the surface after its application onto the substrate.

In particular using an inkjet print method, very small droplets of the liquid medium may be placed on a substrate very accurately in place and at the same time very fast and at very low costs. An important advantage of the present invention therefore is that it neither depends on the speed of a gripper nor on its capability to grip and align a very small component. The present invention rather uses the extremely high throughput in comparison to a gripper, using which liquid volumes may be applied to a substrate for example using the mentioned inkjet printing method. Further, the present invention uses the high precision which may at the same time be achieved here. In this connection, the printing speed and the revolution are noted which are achieved by modern inkjet printers. Thereby, a liquid volume may be placed on a surface of a substrate so that the (very small) wetted partial area of the surface includes the predetermined location in which the component is to be applied onto the substrate.

Further, the present invention is based on the idea to use special surface structures on the component or the microchip or the substrate, respectively, to cause a lateral self adjustment and preferably simultaneously an alignment of the component relative to the substrate preferably in cooperation with the liquid medium.

More generally, according to the present invention the component or the predetermined location of the surface of the substrate to which the component is to be applied are implemented so that after the application of the liquid volume a force acts on the component which is sufficient to drive or move, respectively, the component within the liquid volume to the predetermined location by itself or for example together with a Brownian movement of the same.

As, according to the present invention, a preferably very small liquid volume is preferably applied very accurately to the location to which the component is to be applied on the surface of the substrate or where it later has to fulfill its function, respectively, the component will reach the predetermined location from the outside very fast and without further ado. In other words, according to the present invention, in contrast to a pure self assembly method in which the whole substrate is immersed into a liquid containing the component, a large part of the probability process of the approximation of the component to the predetermined location is prevented or shortened, respectively. Such a probability process would for example be an arbitrary movement of the component which would have to be supported by a flow, by leading through a gas, or by ultrasonics for large liquid volumes. According to the present invention, only the final adjustment of the component at the predetermined location on the surface of the substrate is performed within the liquid droplet.

According to a preferred embodiment of the present invention, the surface structures include hydrophilic and hydrophobic or lipophobic and lipophilic layers or sections, respectively, or layers or portions, respectively, with complementary macromolecule pairs, for example DANN, wherein the layers or portions, respectively, are arranged in suitable graphical patterns.

According to a further preferred embodiment of the present invention, the liquid volume includes a quickly or very quickly volatile liquid, respectively, or such as a medium, respectively. This is in particular the case when the alignment and attachment of the component to the predetermined location on the surface of the substrate is not to be performed by the liquid forces but for example by mechanical, electrostatical or other effects. Preferably, when drying the liquid, electrical contacts or pre-stages of contacts result which may be processed further. Further, the component is preferably fixed on the substrate when drying the liquid.

Thus, the present invention provides a method, wherein components do not have to be introduced on a substrate or in a circuit, respectively, individually by a pick-and-place-method after separating, but are applied very quickly and precisely for example using an inkjet printing method or another printing method.

BRIEF DESCRIPTION OF THE DRAWINGS

These and other objects and features of the present invention will become clear from the following description taken in conjunction with the accompanying drawings, in which.

DESCRIPTION OF THE PREFERRED EMBODIMENTS

Figure 1:
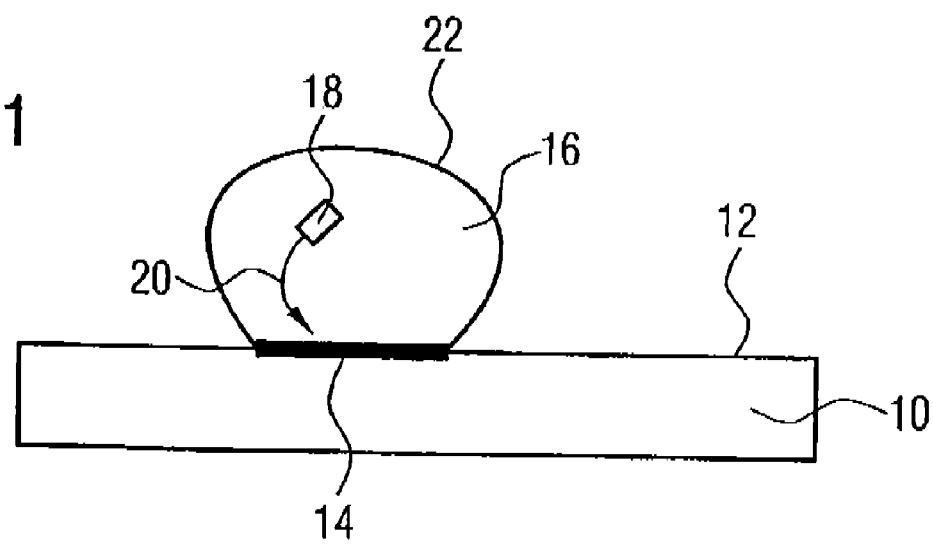
FIG. 1 to 4 show schematical illustrations of a substrate having a component during a method according to preferred embodiments of the present invention.

FIG. 1 is a schematical illustration of a substrate 10 with a surface 12 according to a first embodiment of the present invention. A partial area 14 of the surface 12 is wetted by a liquid volume 16 containing a component 18. The substrate 10 is for example a printed circuit board, a ceramic substrate, paper or foil, a semiconductor substrate or another substrate, to which or to whose surface 12, respectively, the component 18 is to be applied. The component 18 is for example an electronic, microelectronic or micromechanical device which in turn for example consists of a semiconductor material or of plastics. The component 18 was for example formed together with many other like components in a device substrate and was then separated. The component 18 preferably comprises dimensions in a range from 1 nm to one or few mm.

The liquid volume 16 containing the component here is a drop which was for example applied to the surface 12 of the substrate 10 by an inkjet printing apparatus similar to a print head of a conventional inkjet printer. The lateral arrangement, the shape and the size of the partial area 14 of the surface 12 of the substrate 10 which is wetted by the liquid volume 16 is preferably determined by the inkjet printing process, i.e. by the location to which the nozzle of the inkjet print head was directed when the same ejected the liquid volume 16 and by the size of the liquid volume 16 and the speed with which it hit the surface 12 of the substrate 10. Alternatively, the exact lateral arrangement, the shape and the size of the partial area 14 are further determined by a predetermined constitution of the surface 12 of the substrate 10. For example, the partial area 14 of the surface 12 was already prepared in a hydrophilic way before applying the liquid volume, while adjacent areas of the surface 12 are hydrophobic and the liquid volume 16 includes a polar liquid. By this it is caused that the liquid volume 16, although it only partially overlaps with the partial area 14 after it hits the surface 12 of the substrate 10, spontaneously takes on the position and shape shown in FIG. 1 in which the hole partial area 14, but only the same, is wetted.

Alternatively, the liquid volume 16 comprises a non-polar liquid and the partial area 14 is lipophilic, wherein a partial area adjacent to the partial area 14 of the surface 12 is lipophobic.

The component 18 contained within the liquid volume 16 is located in any location within the liquid volume 16 directly after the application of the liquid volume 16 onto the partial area 14 of the surface 12. The component 18 is implemented so that after applying the liquid volume 16 a force acts on the same driving it to a location predetermined for the same.

One example for this force is gravitation. At that, the component 18 is implemented so that its specific weight is greater than that of the liquid of the liquid volume 16. When the whole partial area 14 represents the location predetermined for the component 18, the substrate 10 is arranged horizontal to the surface 12 facing upwards, i.e. facing away from the center of the earth. The component 18 then falls onto the partial area 14 slowed down by the viscosity of the liquid of the liquid volume 16. This movement is indicated by the arrow 20. Hydrodynamic forces act on the component 18, which depend on the spatial orientation of the component 18, except with a ball shape of the component 18. Apart from that, the movement of the component 18 is for example influenced by the so called Brownian movement. For both reasons, the component 18 travels along a path 20 which is not necessarily straight, but which may include one or several discrete or also continuous changes of direction, as it is illustrated in FIG. 1.

Alternatively, the component 18 is implemented so that its specific weight is lower than that of the liquid of the liquid volume 16. The component 18 in this case only approaches the partial area 14 when the substrate 10 with the liquid volume 16 is held so that the surface 12 is facing the center of the earth.

In both cases, the time that the component 18 requires to impinge on the partial area 14, from its original location within the liquid volume 16, depends on the size of the liquid volume 16, on the viscosity of the liquid of the liquid volume 16, of the difference of the densities of the component 18 and the liquid of the liquid volume 16 and on the hydrodynamic characteristics of the component 18, in particular its size and shape.

The predetermined location to which the component is to be applied on the surface 12 of the substrate 10 may also be determined more accurately than illustrated in FIG. 1. According to one embodiment, the edge of the partial area 14 comprises a corner whose place represents the predetermined location for the component 18. In case of a component 18 which is heavier than the liquid of the liquid volume 16 displaced by the same, the substrate 10 is spatially aligned so that the mentioned corner represents the deepest point of the liquid volume 16. In this case, the component 18 automatically falls to its predetermined location. In case of a component 18 which is lighter than the liquid of the liquid volume 16 displaced by the same, the substrate 10 is held so that the mentioned corner forms the highest point of the liquid volume 16.

In case of a component 18 which adheres to the partial area 14 at the first contact, the substrate 10 is primarily adjusted so that the component 18 first of all cannot yet contact the partial area 14. In case of a component 18 whose density is greater than that of the liquid of the liquid volume 16, the substrate 10 is for this purpose first spatially aligned so that the surface 12 is perpendicular or even at least partially faces the center of the earth. The substrate 10 remains in this spatial alignment until it may be assumed with a high probability that the component 18 has fallen on the surface 22 of the liquid volume 16, wherein the surface 22 represents the interface between the liquid volume 16 and the surrounding atmosphere. Afterwards, the substrate 10 is rotated so that the component 18 slides along the surface 22 to the mentioned corner of the partial area 14.

According to a preferred variant of the present invention, the described movement of the component 18 is accelerated to the predetermined location 24, by using the centrifugal force of the component 18 in a centrifuge instead of the gravitational force of the same.

In particular when using a centrifuge, instead of a liquid with a low viscosity also a liquid with a high viscosity or a paste, respectively, may be used for forming the liquid volume 16.

Alternatively, or in addition to the gravitational force further forces may act on the component, for example electrostatic or magnetic forces, generated by an exterior electric or magnetic field, respectively. An electric field exerts a force on the component 18 when it carries an electric (monopole) charge. This charge acts in parallel to the electric field or its "field lines".

In a non-homogeneous electric field a force is exerted also on an uncharged component 18, when the electric polarizability of the component 18 is different from that of the surrounding liquid of the liquid volume 16.

Each electric field further exerts an adjusting torque onto the component 18 when the component 18 comprises an anisotrope polarizability. An anisotropic polarizability of the component 18 is for example present when the component 18 comprises a longitudinal shape or a plate shape or a material with an anisotrope polarizability or circuit board structures which enable an easier charge shift in one direction compared to a direction perpendicular to the same.

An exterior magnetic field exerts an aligning torque onto a component 18 with a permanent magnetic dipole moment or an anisotropic magnetizability. A non-homogeneous exterior magnetic field further exerts a (linear) force onto a component 18 with a magnetic dipole moment.

By an exterior electric or magnetic field the component 18 may thus be moved and aligned translatory within the liquid volume 16. At that, apart from the mentioned permanent or induced electric or magnetic monopole or dipole moments also higher moments may be used. Further, electromagnetic alternating fields may be used.

According to a further preferred variant, by a light field of a high intensity which intersperses the liquid volume, a force is exerted on the component. This force may have two causes depending on the nature of the liquid, the component and its surface and on the wavelength of the used light. On the one hand, photons reflected or absorbed at the component exert a force on the component due to the impulse that they carry. On the other hand, the absorption of photons causes a heating up of the surface of the component and of the liquid layer adjacent to the same. This heating up in turn causes an increased impulse carry between molecules of the liquid and the surface of the component and thus a higher pressure.

Figure 2:
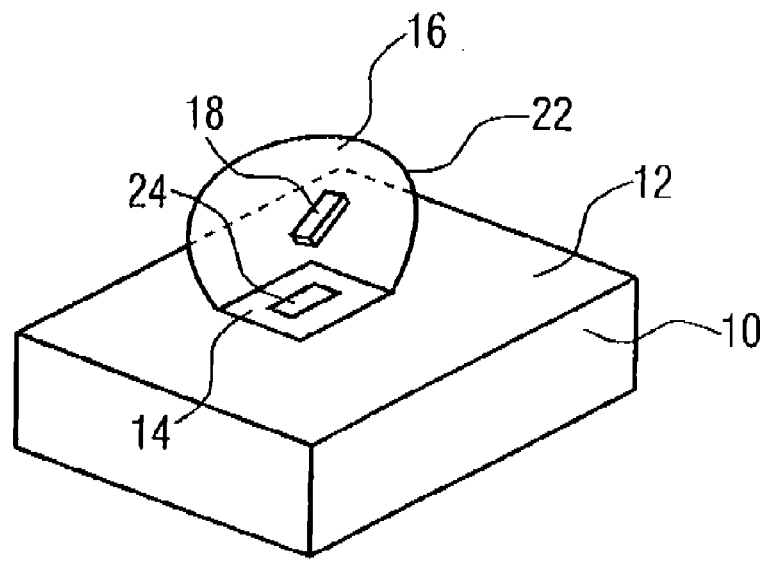

FIG. 2 is a schematical perspective illustration of a substrate 10 with a surface 12 according to a further preferred embodiment of the present invention. A partial area 14 of the surface 12 is wetted by a liquid volume 16. Arrangement, shape and size of the partial area 14 are determined by the place in which the liquid volume 16 was applied to the surface 12 and by the size of the liquid volume 16, like in the preceding embodiment, or by arrangement, shape and size of the partial area 14 which is different from an adjacent area of the surface 12 in its wetting characteristics. At that, a partial area 14 substantially deviating from a circular form may generally only be generated in the second way, as it is illustrated in FIG. 2.

Within the partial area 14 a predetermined location 24 exists in which the component 18 is to be applied onto the surface 12. This predetermined location 24 or the component 18 are implemented so that in the state illustrated in FIG. 2 after the application of the liquid volume 16 onto the surface 12 of the substrate 10 a force acts onto the component 18 which is sufficient in order to drive or move, respectively, the component 18 within the liquid volume 16 to the predetermined location 24. This force preferably already acts on the component 18 when the component 18, as illustrated in FIG. 2, not yet contacts the partial area 14 of the surface 12 but is still present in the interior of the liquid volume 16. Alternatively, the force only acts when the component 18 punctually or planarily contacts the partial area 14 of the surface 12. The force preferably includes a linear force, which draws the component 18 to the predetermined location 24. Alternatively or additionally the component 18 and the predetermined location 24 are further implemented on the surface 12 of the substrate 10 so that an aligning torque acts on the component 18.

Figure 4:
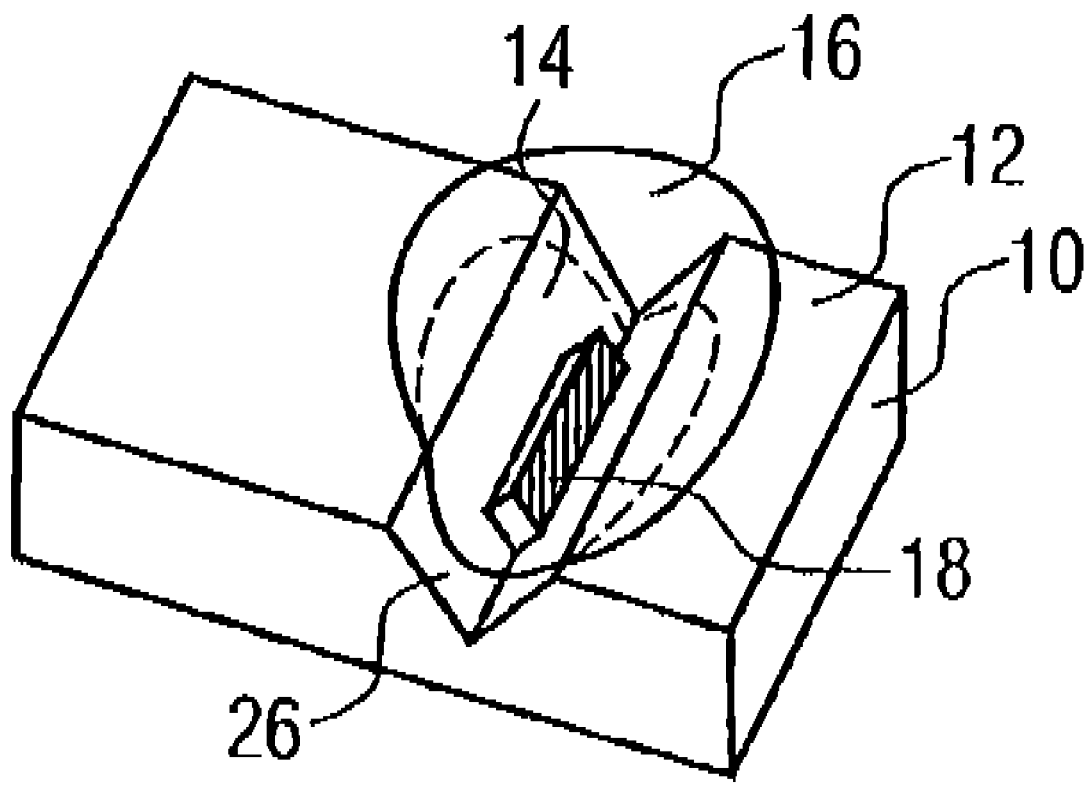

The implementation of the component 18 or the predetermined location 24 of the surface 12 causing the force or the torque, preferably consists in a corresponding shaping of the component 18 and a lateral structuring of the nature of the surface 12. For example, the component 18 is provided with a hydrophilic surface or a hydrophilic partial area of its surface. The predetermined location 24 is also hydrophilic, wherein shape and size of the hydrophilic predetermined location 24 correspond to shape and size of the component 18 or the hydrophilic partial area of the surface of the component 18, respectively. The portion of the partial area 14 of the surface 12 surrounding the hydrophilic predetermined location 24 is hydrophobic. The component 18 is in this case rejected by the hydrophobic portion of the partial area 14 and attracted by the hydrophilic predetermined location 24. With a longitudinal shaping of the component 18 and the predetermined location 24, as it is illustrated in FIG. 4, further an alignment of the component 18 corresponding to the predetermined location 24 is performed.

Alternatively, the predetermined location 24 and the surface of the component 18 or a partial area of the same are implemented in a hydrophobic or lipophilic way, respectively, wherein the portion of the partial area 14 surrounding the predetermined location 24 is implemented in a hydrophilic or lipophobic way.

In both cases, the liquid of the liquid volume 16 is preferably implemented so that it wets both hydrophilic or lipophobic and also hydrophobic or lipophilic surfaces, respectively, and thus the complete partial area 14 of the surface 12 including the predetermined location 24 and the complete component 18, if applicable, including any hydrophilic and lipophilic areas of its surface.

Alternatively or additionally, other surface characteristics are selectively structured laterally in order to define the predetermined location 24 or the predetermined alignment of the component 18 on the surface 12 of the substrate 10. For example, the component 18 or a partial area of its surface and the predetermined location 24 are provided with complementary DNA single-strands on the surface of the substrate 10 which hybridize at an approach of the component 18 to the predetermined location 24 and thus provide a mechanical connection between the component 18 and the surface 12 of the substrate 10.

In order to achieve that the component 18 is applied to the predetermined location 24 of the surface 12 of the substrate 10 only with a predetermined direction and not rotated against the same by 180° for example in case of a component 18 whose function depends on the direction of its assembly or its application, respectively, on the surface 12 of the substrate 10, according to one variance of the embodiment illustrated in FIG. 2, the two ends of the component 18 and the two corresponding ends of the predetermined location 24 are implemented differently. For example, one end of the component 18 and one end to be connected to the same of the predetermined location 24 receive hydrophilic surfaces, while the other end of the component 18 and the second end of the predetermined location 24 to be connected to the same receive a lipophilic surface.

Figure 3:
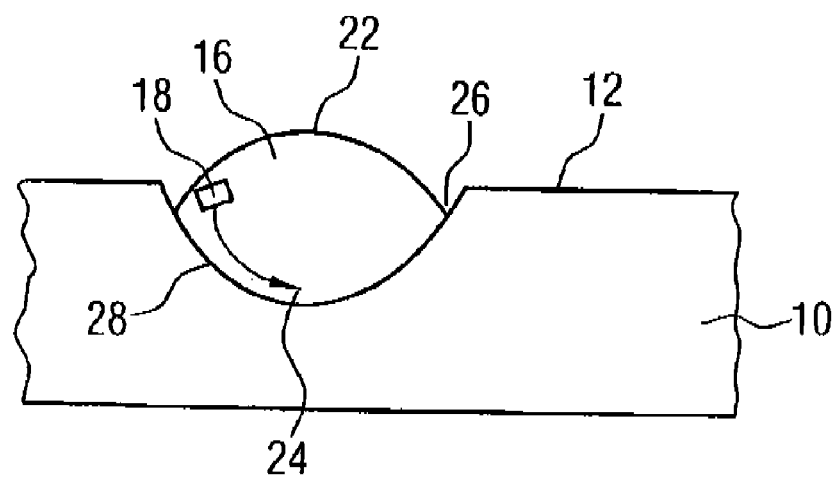

FIG. 3 is a schematical sectional view of a substrate 10 with a surface 12 according to a further preferred embodiment of the present invention. The surface 12 comprises a depression or a recess 26, respectively. Using an inkjet printing device or another suitable device, a liquid volume 16 was applied within the recess 26 of the surface 12. The size of the liquid volume 16 and the place in which the liquid volume 16 was applied to the surface 12 were selected so that the liquid volume 16 wets the surface 12 only within the recess 26. In other words, the partial area 14 of the surface 12 wetted by the liquid volume 16 is present completely within the recess 26.

The surface 22 of the liquid volume 16 is partially outside the space area which is formed by the recess 26 and bounded by the level defined by the surface 12 outside the recess 26. Alternatively, the liquid volume 16 is selected so small that its surface 22 does not reach beyond the level defined by the surface 12 outside the recess 26.

The recess 26 comprises a circular, U-shaped, V-shaped, box-shaped or rectangular, trapezoidal or any other cross section. In the lateral direction, the recess 26 comprises the form of a circle, an ellipsoid, an oval or a rectangle or any other form. Preferably, the recess 26 is implemented so that it is tapered towards the bottom, i.e. into the substrate 10. Again preferably the recess 26 comprises an approximately V- or U-shaped cross section, as it is schematically illustrated in FIG. 3.

One component 18 contained within the liquid volume 16 sinks due to the influence of gravitation to the surface 28 of the recess 26 and then slides along the same to the deepest point of the recess 26 which represents the predetermined location 24 for the component 18. Similar to the embodiment illustrated with reference to FIG. 1, the substrate 10 is here facing away from the center of the earth with its surface 12, when the mean density of the component 18 is larger than that of the liquid of the liquid volume 16. When the density of the liquid of the liquid volume 16 is greater than the mean density of the component 18, the substrate 10 is aligned so that its surface 12 is facing the center of the earth.

One alignment of the component 18 at the predetermined location 24 is performed, as described above with reference to FIG. 2, by a special implementation of the component 18 and the predetermined location 24 from which an aligning torque on the component 18 results. Alternatively, an aligning force or an aligning torque, respectively, on the component 18 also results from the form of the recess 26 and the form of the component 18. This is described in more detail in the following with reference to FIG. 4.

FIG. 4 is a schematical prospective illustration of a substrate 10 with a surface 12 according to a further preferred embodiment of the present invention. The surface 12 of the substrate 10 comprises a recess 26, as in the above-described embodiment with reference to FIG. 3, which, however, comprises the shape of a channel or groove, respectively, with a V-shaped cross section. A liquid volume 16 wets a partial area 14 of the surface 12 of the substrate 10 or the recess 26, respectively, which is illustrated with a partially dotted border. The liquid volume 16 contains a longitudinal component 18 which is in this example illustrated in a cuboid shape. The component 18 is already arranged at the surface 12 of the substrate 10 in the state illustrated in FIG. 4. Due to the channel form of the recess 26 the component 18 is aligned along the recess 26.

The place of the component 18 is uniquely predetermined within the recess 26 in the direction lateral to the recess 26 by its cross section. In the direction parallel to the recess 26 the arrangement of the component 18 is only roughly determined by the expansion of the partial area 14 of the surface 12 wetted by the liquid volume 16. In order to achieve a defined arrangement of the component 18 also in the direction parallel to the recess 26, alternative measures are taken, as they were described above with reference to FIGS. 1 and 2.

After applying the liquid volume 16 containing the component 18 to the surface 12 of the substrate 10 and, if applicable, the accurate arrangement or alignment of the same at the predetermined location, as it was described above with reference to FIGS. 1 to 4, the liquid volume 16 is removed. This is preferably done by drying or evaporating, respectively, the liquid which is preferably supported or accelerated, respectively, by heat or underpressure or a vacuum, respectively.

The period of time of the evaporation of the liquid volume 16 is thereby also dependent on the characteristics of the liquid of the liquid volume 16. In particular when the attachment and, if applicable, the alignment of the component 18 at the predetermined location 24 on the surface 12, as described above, is mechanically (gravitation), electrically or magnetically supported or accelerated, respectively, a very quickly volatile medium or a very quickly volatile liquid, respectively, may be used for the liquid volume 16. By the evaporation the liquid volume 16 is reduced, whereby also the movement of the component 18 to the predetermined location 24 may be accelerated.

With a complete evaporation of the liquid volume 16 according to a preferred embodiment of the present invention electrical contacts between the component 18 and the surface 12 of the substrate 10 result. Preferably, the component 18 is simultaneously fixed to the surface 12 of the substrate 10.

Figure 5:
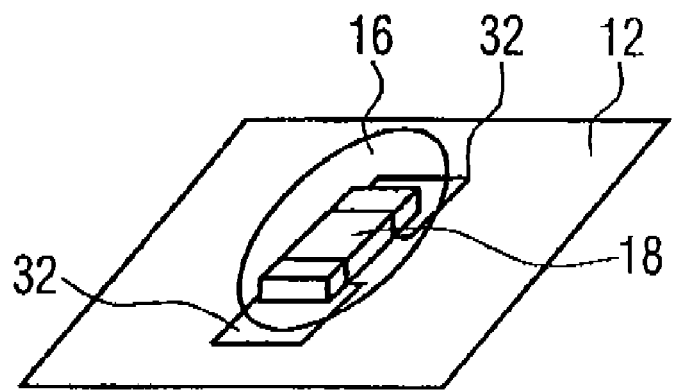
FIG. 5 to 7 show schematical illustrations of a substrate having a component in different stages of a method according to a preferred embodiment of the present invention.
Figure 6:
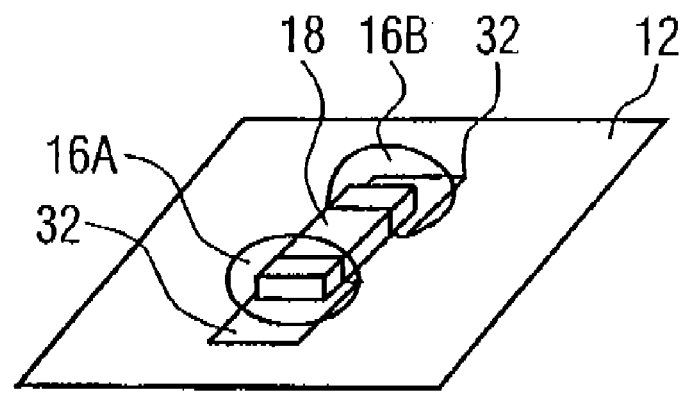
Figure 7:
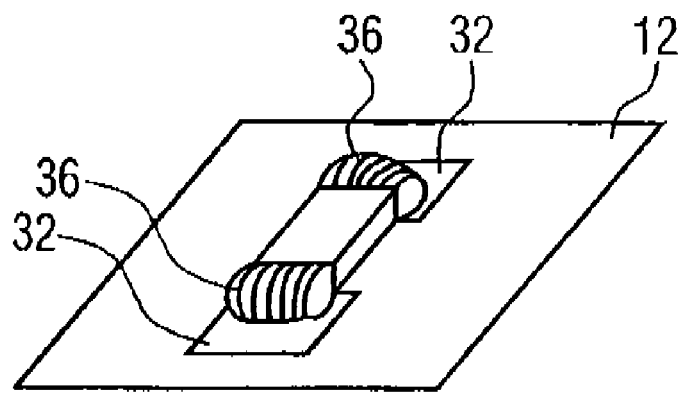

FIGS. 5, 6 and 7 are schematical perspective illustrations of a surface 12 of a substrate with two contact faces 32 and one chip or another component 18 in three different stages. The component 18 includes contact zones 34 which are provided to implement electrically conductive contacts with the contact faces 32. The contact zones 34 of the component 18 are arranged on the upper side, the lower side, a side face or the front faces of the component 18. Preferably, each of the contact zones 34 extends across several sides of the component, as it is illustrated in FIGS. 5, 6 and 7.

The component 18 in FIG. 5 is embedded into a liquid drop or a liquid volume, respectively, arranged on the surface 12 of the substrate. This state is preferably present for example directly after the application of the component 18 within the liquid volume 16 onto the surface 12 of the substrate.

The contact faces 32 on the surface 12 of the substrate and the contact zones 34 of the component 18 are implemented so that they are wetted by the liquid of the liquid volume 16. The rest of the surface 12 of the substrate and the rest of the surface of the component 18 are implemented so that they are not wetted by the liquid of the liquid volume 16. In other words, the contact faces 32 and the contact zones 34 attract the liquid of the liquid volume 16, whereas the rest of the surface 12 of the substrate and the rest of the surface of the component 18 repel the liquid. When the liquid of the liquid volume 16 is polar, for example an aqueous solution, then the contact faces 32 and the contact zones 34 are implemented hydrophilic and the rest of the surface 12 and the rest of the surface of the component 18 are implemented hydrophobic. When the liquid of the liquid volume 16 is non-polar, for example an oily liquid, then the contact faces 32 and the contact zones 34 are implemented lipophilic and the rest of the surface 12 and the rest of the surface of the component 18 are implemented lipophobic.

This implementation of the contact faces 32, the contact zones 34 and the remaining parts of the surface 12 of the substrate and the surface of the component 18 results in a spontaneous or independent or automatic alignment, respectively, of the component 18 on the surface 12 of the substrate. In particular, the component 18 spontaneously aligns so that the wetted contact zones 34 of the component 18 are applied to the contact faces 32 on the surface 12 of the substrate. The component 18 is therefore already arranged and aligned so that electrically conductive contacts may easily be implemented between the contact faces 32 and the contact zones 34.

FIG. 6 shows the surface 12 of the substrate and the component 18 at a point of time which lies after the point of time illustrated in FIG. 5. One part of the liquid of the liquid volume 16 has already evaporated or been removed in another way. As mentioned above, only the contact faces 32 on the surface 12 of the substrate and the contact zones 34 of the component 18 attract the liquid of the liquid volume 16. The rest of the surface 12 of the substrate and the rest of the surface of the component 18 repel the liquid. The remaining liquid therefore spontaneously withdraws to the contact faces 32 and the contact zones 34. The liquid volume 16 is thereby separated and two small liquid volumes 16a, 16b result.

FIG. 7 shows the surface 12 of the substrate and the component 18 at a later point of time. All parts of the liquid comprising a sufficient vapor pressure under the given conditions have evaporated or vaporized, respectively. What remained are only ingredients 36 of the liquid volume 16 comprising an (approximately) infinitesimal vapor pressure, for example (originally) suspended solid particles. These ingredients 36 have been deposited at the contact faces 32 and the contact zones 34. Preferably, these ingredients are selected so that they form a basis or a base material, respectively, or a contacting or a temporary contacting there. In a subsequent method step a conversion or amplification to a firm and permanent contacting results, for example by one or several immersing baths. At that, in deviation of the illustration in FIGS. 5, 6 and 7, with components 18 comprising more than two contact zones 34 simultaneously, a corresponding number of contacts may be formed.

The process illustrated in FIGS. 5, 6 and 7 may be supplemented by an adhesive layer arranged on the surface 12 of the substrate between the contact faces 32 and/or at the component 18 between the contact zones 34. The adhesive layer is preferably activated by the liquid of the liquid volume 16. After the drying of the liquid of the liquid volume 16 the adhesive layer solidifies and forms a stable and permanent mechanical connection between the component 18 and the surface 12 of the substrate.

The liquid volume 16 preferably contains aqueous alcoholic or oily solutions or combinations, for example an emulsion. The selection of the characteristics of the solution depends on the adjustment faces. When the contact faces 32 and the contact zones 34 are hydrophilic, the liquid volume 16 preferably contains a polar liquid, for example an aqueous solution. When the contact faces 32 and the contact zones 34 are lipophilic, the liquid volume 16 preferably contains a non-polar liquid, for example an oily solution.

According to a preferred variant of the present invention, two different liquids are used, i.e. a polar and a non-polar one. First of all, for example an alcoholic or aqueous liquid is printed, injected or applied to the surface 12 of the substrate in another way and forms a drop or another liquid volume 16 there. Into this liquid volume 16 subsequently a component 18, for example a chip, is introduced, which is encapsulated or surrounded, respectively, by an oily pasty solution. The component 18 will then for example be applied at the surface 12 of the substrate, where the same is lipophilic.

According to a further preferred variant, an emulsion of oily pasty droplets respectively containing several, preferably, however, one component 18, is applied in an alcoholic or aqueous solution to the surface 12 of the substrate. First of all, the alcoholic or aqueous liquid volume 16 causes a coarse adjustment of the one or the several oily droplets on the coarser structure of hydrophilic and hydrophobic fields. After the one or the several oily droplets have been centered on the structure of the field and possibly only after an evaporation of the alcoholic or aqueous liquid volume 16 an adjustment of the oily droplets with the components 18 results by lipophilic and lipophobic fields. After an oily droplet has been adjusted on an interior field, it wets the contact faces 32 on the surface 12 of the substrate. Afterwards, for example by a sintering process, contacts are formed between contact zones 34 of the component which was contained within the oily droplet and between the contact faces 32 on the surface of the substrate are formed. For forming the contacts the oily droplet preferably contains a metallic component, for example nano tin-laid solder balls. This concept may be extended, varied and refined almost invariably.

The present invention is in a very special way suitable for components with dimensions in the area below 1 mm down to 1 nm and below, as their mass is low. The present invention is, however, also suitable for components with dimensions in the area of 1 mm and above, in particular when it is for example components or chips, respectively, of thinned substrates, comprising a very low mass. At that, advantageously the characteristics of the liquid are adjusted to the size, the mass and the hydrodynamical characteristics of the components. Generally, for larger components and for components with a larger mass a liquid is advantageous forming larger drops. A resinous liquid for example enables drops with diameters in the range from mm to cm.

The larger and the more massive the individual component is, the slower the inventive method generally runs. In order to prevent a limitation of the throughput, preferably the parallelism is increased, i.e., parts of the inventive method are performed in parallel multiple or several times. This, however, does not represent a disadvantage, as the overall method and in particular the speed determining steps only require small investments in devices and only cause low other method costs.

Figures 8A, 8B:
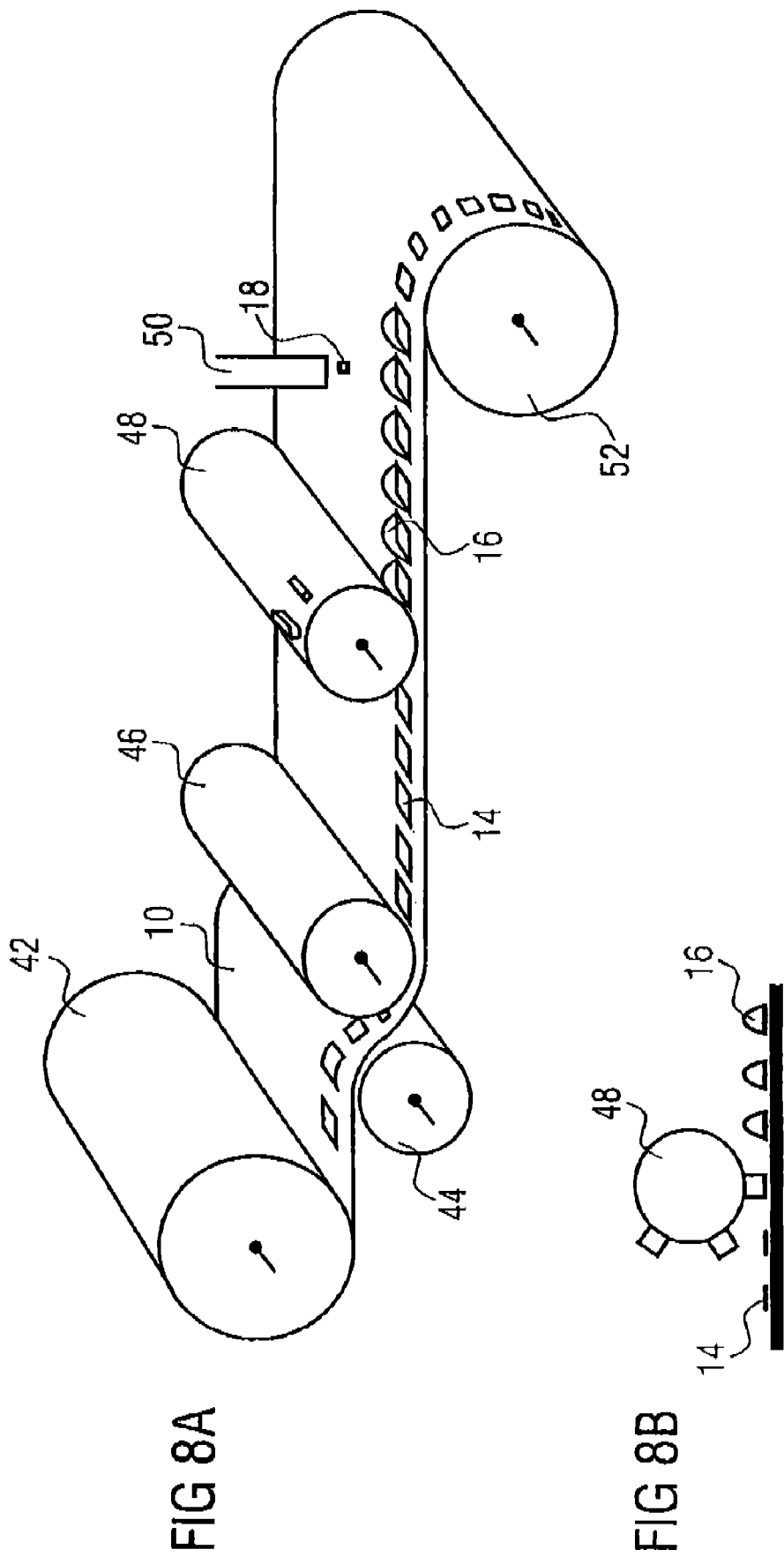
FIGS. 8A and 8B show schematical illustrations of a device for performing an alternative method according to the present invention.

As an alternative to the printing methods already mentioned above, an application of the liquid volumes using a roller printing method or a roller-to-roller-method or a (large) parallel dispenser is advantageous. This is illustrated in the following with reference to FIGS. 8A and 8B. FIG. 8A is a schematical perspective illustration of some of the most important means for performing a roller printing method. The substrate 10 onto which the components 18 are to be applied consists of paper, plastics foil or another foil-type material which is imprinted with traces or other features, if applicable. The substrate 10 is first present in the form of a roller 42 of which it is preferably continuously rolled off. The substrate is directed and driven or transported, respectively, by guiding and transport rollers or drums 44, 46, respectively. Using a drum 48 liquid volumes 16 are deposited onto partial areas 14 including predetermined locations 24 for the components 18. For this, for example high-pressure or low-pressure methods may be used. The deposition of the liquid volumes 16 onto the substrate 10 using the drum 48 is illustrated schematically in a longitudinal section in FIG. 8B.

The liquid volumes 16 preferably already contain the components 18. Alternatively, the components 18 are only introduced in a subsequent station into the liquid volumes 16. This is illustrated schematically in FIG. 8A by a nozzle 50 injecting a component 18 or a liquid drop containing a component 18 into a liquid volume 16.

After the liquid volumes 16 and the components 18 are applied to the substrate 10, the substrate 10 preferably runs through further method steps as they were already illustrated above using the preceding embodiments. These further method steps and means required for their performance are not illustrated in FIG. 8A. Steps for drying or removing, respectively, volatile parts of the liquid volumes 16 and for implementing, reinforcing or stabilizing electrical contacts and mechanical connections between the components 18 and the substrate 10 count among the further method steps.

Preferably after the drying of the liquid volumes 16 and the complete implementation of the electrical contacts and the mechanical connections, the substrate 10 is rolled onto a further roller 52. This roller 52 is then transported to a dicing means which may be arranged spatially spaced apart from the means illustrated in FIG. 8A. There, the substrate 10 is diced. By cutting, sawing or similar methods, the substrate 10 is separated lengthwise and crosswise in order to obtain individual devices or electronic circuits, respectively, including one or several of the components 18.

Using the method described with reference to FIGS. 5A and 8B it is possible to assemble components with dimensions in a range below one mm, but also thinned components in a size range of one mm. A special advantage of the use of a roller method as it was illustrated in FIGS. 8A and 8B is the extremely high throughputs which may be achieved.

Similar to the roller print method illustrated with reference to FIGS. 8A and 8B, also fast side processes may be used. At that, apart from flexible substrates made of foil, paper and other flexible materials, also fixed or non-flexible, respectively, in particular brittle substrates may be used.

Preferably, the liquid volume 16 is formed or taken, respectively, from a liquid containing a plurality of components 18 equal to each other. The ratio of the number of components 18 equal to each other within the liquid to the overall amount of the liquid or the size of the liquid volume 16 are selected so that the liquid volume 16 includes at least one component 18 with a probability which is regarded as sufficient and which is predetermined for the respective application.

Alternatively, after the application of the liquid volume 16 onto the surface 12 of the substrate 10 it is tested whether the liquid volume 16 contains a component 18. If this is not the case, after drying or evaporation, respectively, of the liquid volume 16 a further liquid volume 16 is deposited onto the surface 12 of the substrate 10 and the process is repeated until a liquid volume 16 was deposited on the surface 12 of the substrate 10 containing a component 18. Alternatively, by a controlled method a liquid volume 16 is generated which reproducibly accurately contains one component 18.

According to preferred variants of the present invention, the liquid volume includes several different components. The liquid volume is for this preferably formed from a liquid respectively containing a plurality of components of several different component types. The different components are preferably different in so far that the arranging forces or the aligning torques selectively act on the components.

Instead of an inkjet printing apparatus for applying the liquid volume 16 onto the surface 12 of the substrate 10 another drop generating means may be used by which a liquid volume 16 or a drop, respectively, may be generated. For example, a drop may be detached from a needle or a nozzle due to its inertia by the effect of its gravitational force or a centrifugal force or in a jerky movement of the drop generating means. The liquid volume 16 or the drop, respectively, is thereby after detaching the same from the drop generating means preferably held together by its surface tension, wherein it generally takes on an approximately ball-shaped form.

In the above illustrated embodiments, hydrophilic or lipophobic and hydrophobic or lipophilic characteristics, respectively, of surfaces and liquids are used in order to cause a spatially selective and/or aligned attachment of components. Alternatively, other characteristics of surfaces and of molecules are used which may be deposited onto surfaces in a structured way determine their characteristics. The already mentioned DNA single strands offer the advantage that they comprise an electrical conductivity which may serve for the implementation of electrical contacts between a component and the substrate. In addition, for example also uric acid type substances or molecules, respectively, may be used.

The present invention may be implemented both as a method and as a device for manufacturing a system with a substrate and a component applied to a predetermined location of a surface of the substrate. The inventive device includes means for generating a liquid volume containing a component and means for applying the liquid volume containing the component onto the surface of the substrate. These means are, as mentioned above, for example an inkjet print head with an inkjet nozzle.

The present invention may be used for the assembly of electrical, electronic, optical, opto-electronic and other systems. At that, processes, method steps, means and features of the substrate, the liquid volume and the component illustrated in the different embodiments may be combined in order to assemble individual components or a respective plurality of components, for example chips, to a system. The present invention thus facilitates assembling or printing of whole chip assemblies, respectively.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

The invention claimed is:

1. A method for producing a system comprising a substrate having a surface and a plurality of device components applied to different predetermined locations of the surface of the substrate, comprising:
   generating a plurality of liquid volumes, each liquid volume containing at least one device component; and
   accurately applying each of liquid volume of the plurality of liquid volumes onto the predetermined locations of the surface of the substrate, in which the components contained in the droplets are to be located
   wherein each of the liquid volumes is sized so small that each liquid volume wets only a predetermined partial area of the surface of the substrate after application of each liquid volume, the predetermined partial area being different for each liquid volume of the plurality of liquid volumes,
   wherein, in the step of applying, each liquid volume is placed on the surface of the substrate so that the predetermined partial area of the surface wetted by the liquid volume includes the predetermined location for the at least one device component contained in the liquid volume,
   wherein the shape and size of the partial area wetted by a respective liquid volume is determined
      by a location on which the liquid volume was directed in the step of applying, by the size of the liquid volume and the speed with which the liquid volume hit the surface of the substrate, or
      by a predetermined constitution of the partial area of the surface of the substrate, which is different from an adjacent area of the surface in its wetting characteristics so that the whole partial area and only the partial area is wetted by a respective liquid volume, and
   wherein the at least one device component contained in a respective liquid volume or the predetermined location of the surface of the substrate for the respective liquid volume is implemented so that after the application of the respective liquid volume a force acts on the at least one device component contained in the respective liquid volume, the force being sufficient in order to drive the respective device component only within the respective liquid volume to the predetermined location for the respective liquid volume, so that, for each of the plurality of liquid volumes, only a final adjustment of the device component to the predetermined location for the respective liquid volume is performed within the respective liquid volume; and
   removing volatile parts of the liquid volumes from the plurality of liquid volumes and stabilizing mechanical connections between the plurality of respective device components and the respective predetermined locations of the substrate.

2. The method according to claim 1, wherein the step of applying includes a step of ejecting the liquid volume from a nozzle of an inkjet print head or a rotation printing method step.

3. The method according to claim 1, wherein the step of generating the liquid volume includes a step of introducing the device component into the liquid volume.

4. The method according to claim 1, wherein the liquid volume is a drop, which is held together by its surface tension, and wherein the step of generating the drop includes a step of detaching the drop from its drop generating device due to its inertia, by an influence of its gravitational force or a centrifugal force.

5. The method according to claim 1, wherein the liquid volume includes a polar liquid and the partial area of the surface includes a hydrophilic portion which a hydrophobic portion of the surface is adjacent to.

6. The method according to claim 5, further comprising a step of generating the hydrophilic and the hydrophobic portion or a lipophilic and a lipophobic portion, respectively, of the surface.

7. The method according to claim 1, wherein the liquid volume includes a non-polar liquid and wherein the partial area of the surface includes a lipophilic portion which a lipophobic portion of the surface is adjacent to.

8. The method according to claim 1, wherein the step of generating the liquid volume further includes a step of generating a hydrophilic portion on the device component, further comprising a step of generating a hydrophilic portion at the predetermined location of the surface of the substrate,
   wherein the force acting on the device component is an attractive force between the hydrophilic portions on the device component and at the predetermined location of the surface of the substrate.

9. The method according to claim 1, wherein the step of generating the liquid volume further includes a step of generating a lipophilic portion on the device component, further comprising a step of generating a lipophilic portion at the predetermined location of the surface of the substrate, wherein the force acting on the device component is an attractive force between the lipophilic portions on the device component and at the predetermined location of the surface of the substrate.

10. The method according to claim 1, wherein the device component and the predetermined location of the surface of the substrate are further implemented so that after the application of the liquid volume an aligning force acts on the device component which is sufficient in order to align the device component within the liquid volume in a predetermined way.

11. The method according to claim 10, wherein the device component and the predetermined location of the surface of the substrate respectively include one or several hydrophilic or lipophilic portions implemented such that the aligning force at least partially results from attractive forces between hydrophilic portions or between lipophilic portions.

12. The method according to claim 10, wherein the aligning force is at least partially caused by surface structures at the device component or at the surface of the substrate.

13. The method according to claim 1, further comprising a step of drying the liquid volume.

14. The method according to claim 13, wherein the step of drying includes a step of implementing an electrical contact between the substrate and the device component.

15. The method according to claim 1, wherein the substrate is a printed circuit board, a ceramic substrate, a semiconductor substrate, paper, carton or a plastics foil.

16. The method according to claim 1, wherein the device component is a microelectronic or micro-mechanical device.

17. The method according to claim 1, wherein the step of applying the liquid volume includes a step of performing a roller print method.

18. The method according to claim 1, wherein the step of generating the liquid volume includes a step of introducing a plurality of devices being equal in function into a fluid and a step of removing the liquid volume from the liquid.

19. The method according to claim 18, wherein the plurality is selected so that the liquid volume contains at least one of the plurality of device components equal to each other with a predetermined probability.

* * * * *